(12) United States Patent
Trichy Rengarajan et al.

(10) Patent No.: US 8,916,453 B2
(45) Date of Patent: Dec. 23, 2014

(54) METHOD FOR MANUFACTURING AN ELECTRONIC COMPONENT

(71) Applicant: Infineon Technologies AG, Neubiberg (DE)

(72) Inventors: Gopalakrishnan Trichy Rengarajan, Villach (AT); Armin Tilke, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/682,832

(22) Filed: Nov. 21, 2012

(65) Prior Publication Data

US 2014/0138813 A1   May 22, 2014

(51) Int. Cl.
  *H01L 21/00* (2006.01)
  *H01L 21/31* (2006.01)
  *H01L 21/78* (2006.01)
  *H01L 21/683* (2006.01)
  *H01L 23/482* (2006.01)

(52) U.S. Cl.
  CPC ............ *H01L 21/78* (2013.01); *H01L 21/6835* (2013.01); *H01L 23/482* (2013.01); *H01L 2221/6834* (2013.01); *H01L 2221/68327* (2013.01)

USPC .......... 438/464; 438/485; 438/758; 438/460; 438/110; 438/114

(58) Field of Classification Search
  CPC ................................ H01L 21/78; H01L 21/82
  USPC ......... 438/110, 113, 114, 460, 464, 465, 758, 438/759, 778
  See application file for complete search history.

(56) References Cited

U.S. PATENT DOCUMENTS

| | | | | |
|---|---|---|---|---|
| 6,008,070 A | * | 12/1999 | Farnworth | ..................... 438/114 |
| 2009/0134501 A1 | | 5/2009 | Ganitzer et al. | |
| 2009/0243045 A1 | * | 10/2009 | Pagaila et al. | ................. 257/621 |
| 2010/0009518 A1 | * | 1/2010 | Wu et al. | ....................... 438/462 |
| 2011/0175243 A1 | | 7/2011 | Jo et al. | |

\* cited by examiner

*Primary Examiner* — Chuong A Luu
*Assistant Examiner* — Cory Eskridge
(74) *Attorney, Agent, or Firm* — Slater & Matsil, L.L.P.

(57) ABSTRACT

A semiconductor wafer includes a first main face and a second main face opposite to the first main face and a number of semiconductor chip regions. The wafer is diced along dicing streets to separate the semiconductor chip regions from each other. At least one metal layer is formed on the first main face of each one of the semiconductor chip regions.

26 Claims, 4 Drawing Sheets

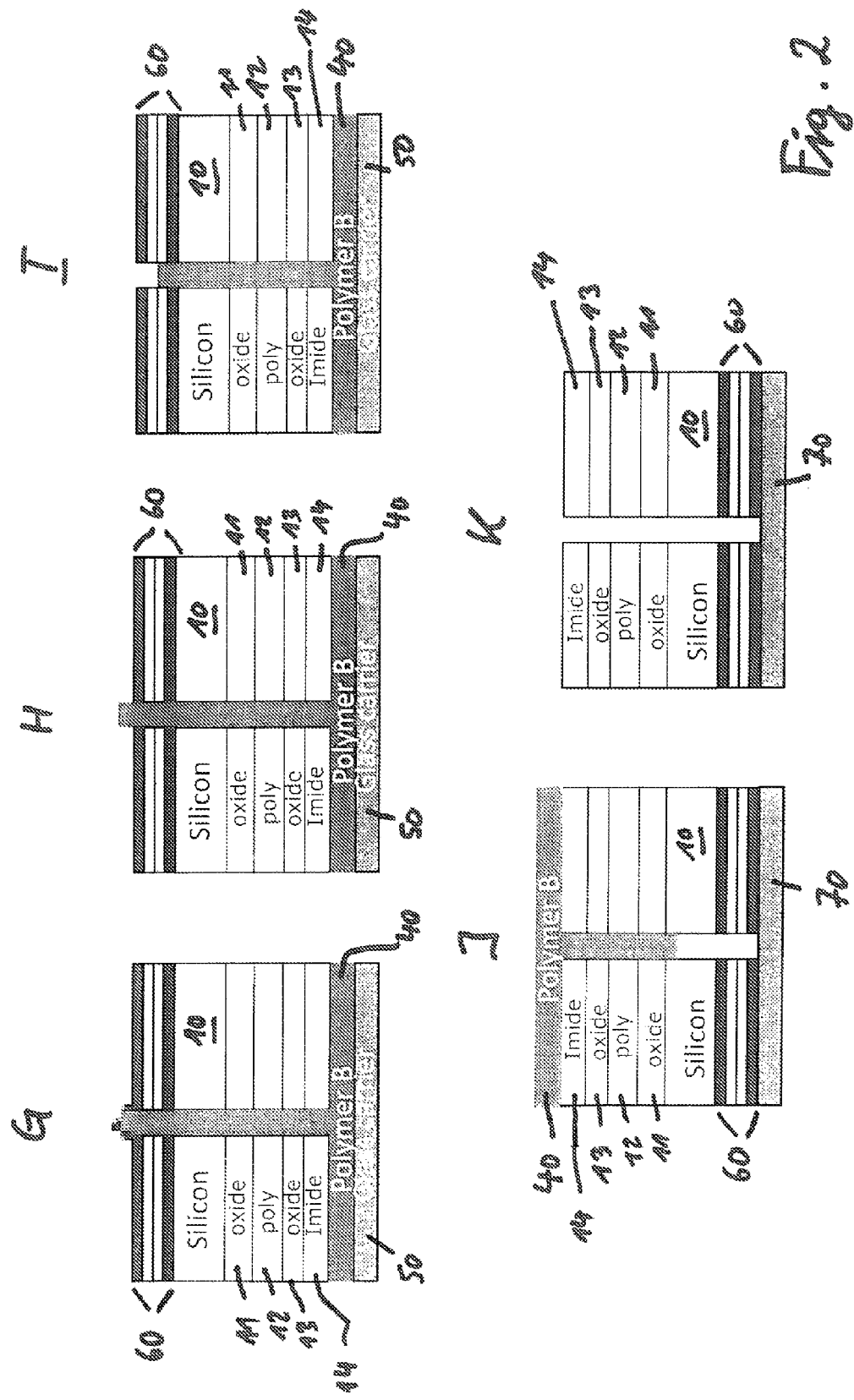

METHOD FOR MANUFACTURING AN ELECTRONIC COMPONENT

TECHNICAL FIELD

The present invention relates to a method, a method for fabricating an electronic component, and an electronic component.

BACKGROUND

A general process for manufacturing a semiconductor device includes a step of fabricating a wafer, a step of processing a plurality of semiconductor chip regions on the wafer, a step of packaging the wafer, and a step of singulating the wafer to obtain a plurality of semiconductor chip packages. In addition, a grinding step may be performed in which the back surface of the wafer is removed by a grinder in order to reduce the thickness of the semiconductor wafer. In addition, one or more steps of applying metallization layers or electrical contact layers can be performed in order to provide electrical connections to the electrical devices included within the semiconductor chip regions.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other.
Like reference numerals designate corresponding similar parts.

DETAILED DESCRIPTION OF ILLUSTRATIVE EMBODIMENTS

Figure 1:
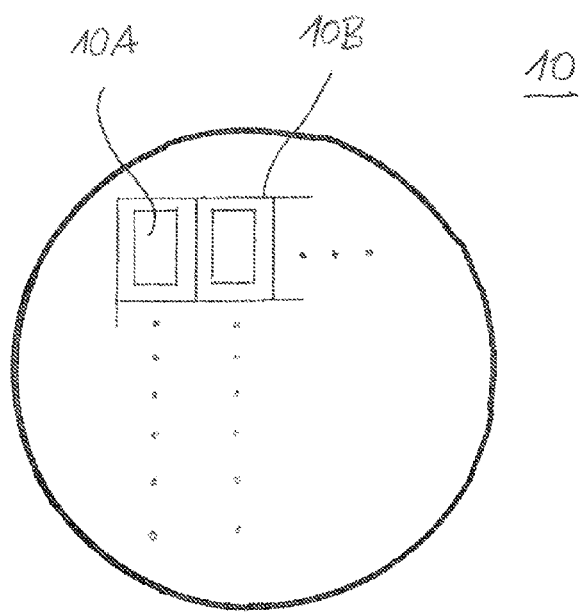
FIG. 1 shows a top view of a semiconductor wafer comprising a plurality of semiconductor chip regions.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic component and a method for fabricating an electronic component may use various types of semiconductor chips or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor or other structures or devices in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating an electronic component are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

FIG. 1 shows a top view of a processed semiconductor wafer. The semiconductor wafer 10 comprises a plurality of semiconductor chip regions 10A having been processed in previous fabrication steps. Each one of the semiconductor chip regions 10A may comprise one or more electrical devices. In particular, each one of the semiconductor chip regions 10A may comprise one or more of a transistor, a vertical transistor, an MOS transistor, and an IGBT (Insulated Gate Bipolar Transistor). The semiconductor wafer 10 may have been thinned in a previous step before fabricating the semiconductor chip regions, in particular by grinding the back surface of the semiconductor wafer 10. The semiconductor wafer 10 may thus have a thickness in a range from 50 μm-300 μm, in particular in a range from 100 μm-200 μm. In the following a method will be described for singulating the semiconductor wafer 10 into individual semiconductor chips and metallizing the back surfaces of the semiconductor chip regions at a wafer level. The step of singulating will include a step of dicing the semiconductor wafer 10 along dicing streets 10B as indicated in FIG. 1.

FIG. 2A-K show schematic cross-sectional views for illustrating a method for fabricating an electronic component.

Figure 2:
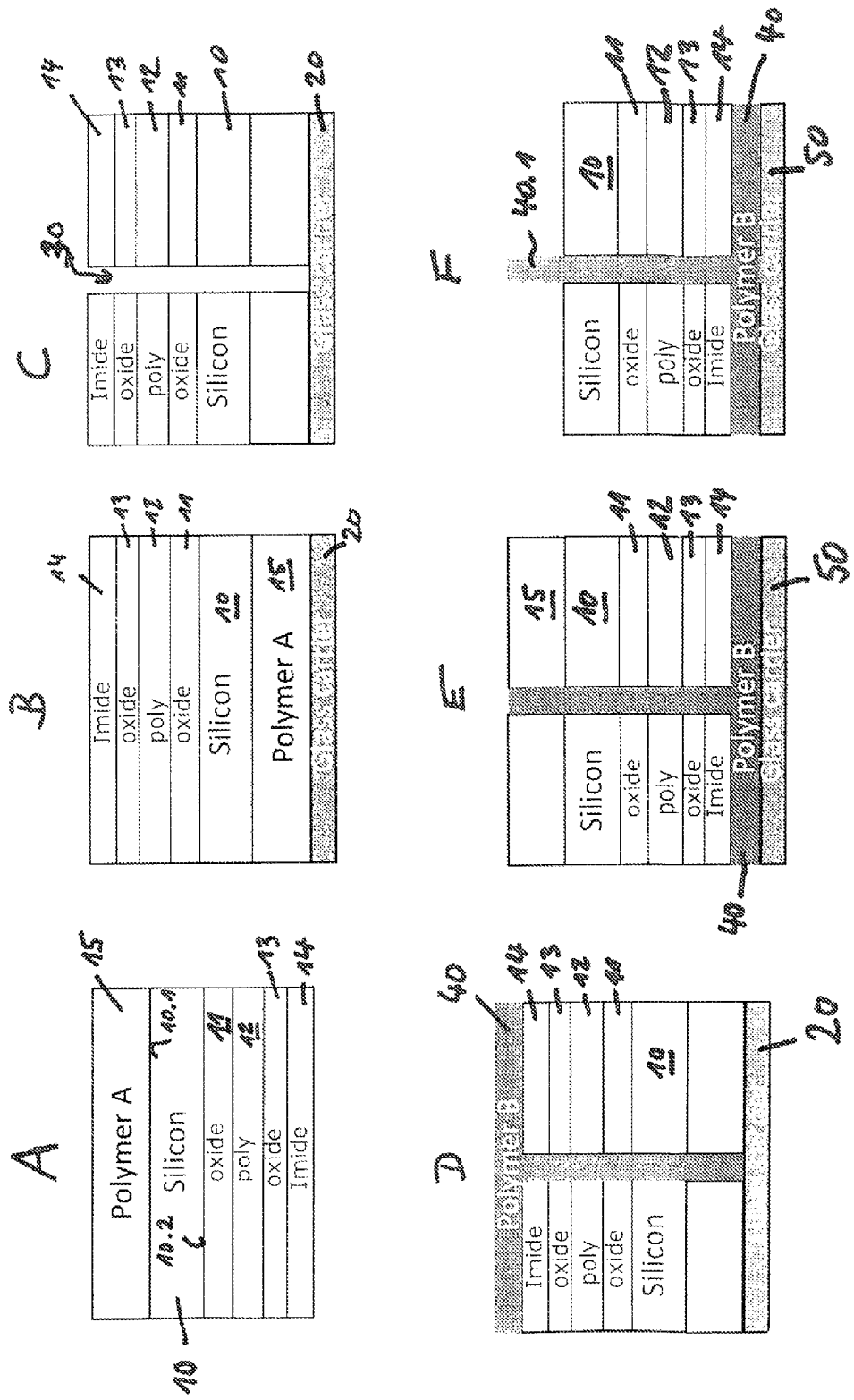
FIGS. 2A-K show schematic cross-sectional side view representations to illustrate a method for fabricating an electronic component according to an embodiment.

FIG. 2A shows a cross-section of a part of the semiconductor wafer 10, wherein the part comprises partial areas of neighboring semiconductor chip regions which are to be separated from each other by the method as described in the following. The semiconductor wafer 10 may be comprised of a silicon wafer and may comprise a first main face 10.1 and a second main face 10.2, wherein the first main face 10.1 can be comprised of a back surface and the second main face 10.2 can be comprised of a front surface of the semiconductor wafer 10. During processing of the semiconductor chip regions 10A of the semiconductor wafer 10, the second main face 10.2 will be exposed to several steps of one or more of oxidizing, etching, photolithographic steps, masking steps, doping, etc. It can be the case that, for example, in each one of the semiconductor chip regions 10A a transistor, in particular a vertical transistor or an insulated gate bipolar transistor (IGBT) is formed by appropriate processing steps performed at the side of the second main face 10.2. Then, either before or after these processing steps or even in-between one of these processing steps, the semiconductor wafer 10 can be thinned by grinding the first main face 10.1. The processed semiconductor wafer 10 may comprise at the second main face 10.2 a stack of layers, in particular passivation layer, deposited one upon the other, in certain areas, in particular in areas outside of the electrical contact areas or pads and in particular near the dicing streets. The layer stack may comprise a first oxide layer 11, a poly-silicon layer 12, a second oxide layer 13, and a (poly)imide layer 14. Then a first material layer 15(A) is deposited on the first main face 10.1 of the semiconductor wafer 10. The material of the first material layer 15 can be selected in such a way that it comprises similar mechanical properties as that of the semiconductor wafer 10, in particular silicon. The material of the first material layer 15 may include or consist of a first material comprising a first solubility parameter.

FIG. 2B shows a cross-section after turning the assembly of the semiconductor wafer 10 and the layers 11-14 upside down and attaching it with the first material layer 15 to a glass carrier 20.

FIG. 2C shows a cross-section after dicing the silicon wafer 10, and the layers 11-15 from above, i.e., beginning at the imide layer 14 and dicing through the layers 11 to 13, the silicon wafer 10 and the first material layer 15 down to the first glass carrier 20. The dicing is performed along the streets 10B as shown in FIG. 1. The dicing produces dicing trenches 30 along the dicing streets 10B.

FIG. 2D shows a cross-section of the wafer/carrier assembly of FIG. 2C after applying a second material layer 40(B) to an upper surface of the imide layer 14 in such a way that the second material layer 40 is filled into the dicing trenches 30 and covers the upper surface of the imide layer 14. The second material layer 40 may be comprised of a second polymer. In particular, the second material may be comprised of a material having a second solubility parameter. The first and second material layers 15 and 40 can be selected in such a way that they comprise different solubility parameters. The first material layer 15 can, for example, be comprised of a first polymer like, for example, polystyrene which can be dissolved by, for example, cyclohexane or other suitable solvents, and the second material layer 40 can, for example, be comprised of a second polymer like, for example, PMMA which can be dissolved by acetic acid. The second material layer 40 can be deposited by, for example, spin-coating.

FIG. 2E shows a cross-section after removing the glass carrier 20 from the first material layer 15, turning the assembly upside down and attaching a second glass carrier 50 to the second material layer 40.

FIG. 2F shows a cross-section of the assembly after removing of the first material layer 15. If, for example, polystyrene is used as the first material layer 15, it can be removed by exposing it to an appropriate solvent as, for example, cyclohexane or other suitable solvents to dissolve the first material layer 15. Due to the selective dissolving of the first material layer 15 without affecting the second material layer 40, the second material layer 40 remains within the dicing trenches 30 and between the second glass carrier 50 and the imide layer 14 in such a way that free-standing portions 40.1 of the second material layer 40 remain extending upwards from the first main face 10.1 of the silicon wafer 10, the height of the free-standing portion 40.1 corresponding to the thickness of the first material layer 15, which has been removed before.

FIG. 2G shows a cross-section of the assembly of FIG. 2F after depositing one or more metal layers 60 onto the first main face 10.1 of the silicon wafer 10. During depositing of the metal layers 60 the portion 40.1 of the second material layer 40 functions as a self-aligned mask. The metal layer 60 can be deposited by one or more of electro-plating or sputtering. Due to the masking of the deposition of the metal layer 60, the metal layer 60 of each one of the semiconductor chip regions can be formed with side walls having a very smooth surface, in particular a surface having an average surface roughness of less than 100 nm, in particular less than 50 nm. An adequate definition of the surface roughness will be given below.

FIG. 2H shows a cross-section after removing of metal deposited on the top surface of the portion 40.1 of the second material layer 40.

FIG. 2I shows a cross-section after partially removing the second material layer 40 within the dicing trenches 30. In case of using PMMA as the second material layer 40, an appropriate solvent as, for example, acetic acid or other suitable solvents can be used for selectively removing the second material layer 40.

FIG. 2J shows a cross-section after removing the second carrier 50, turning the assembly upside down and attaching a third carrier 70 to the uppermost layer of the metal layers 60.

FIG. 2K shows a cross-section of the assembly after removing the rest of the second material layer 40. Again the solvent acetic acid can be used for removing the rest of the second material layer 40 if, for example, PMMA is used as the second material layer 40. As a result, a plurality of electronic components 80 are arranged on the third glass carrier 70 and can be detached therefrom for further processing.

Figure 3:
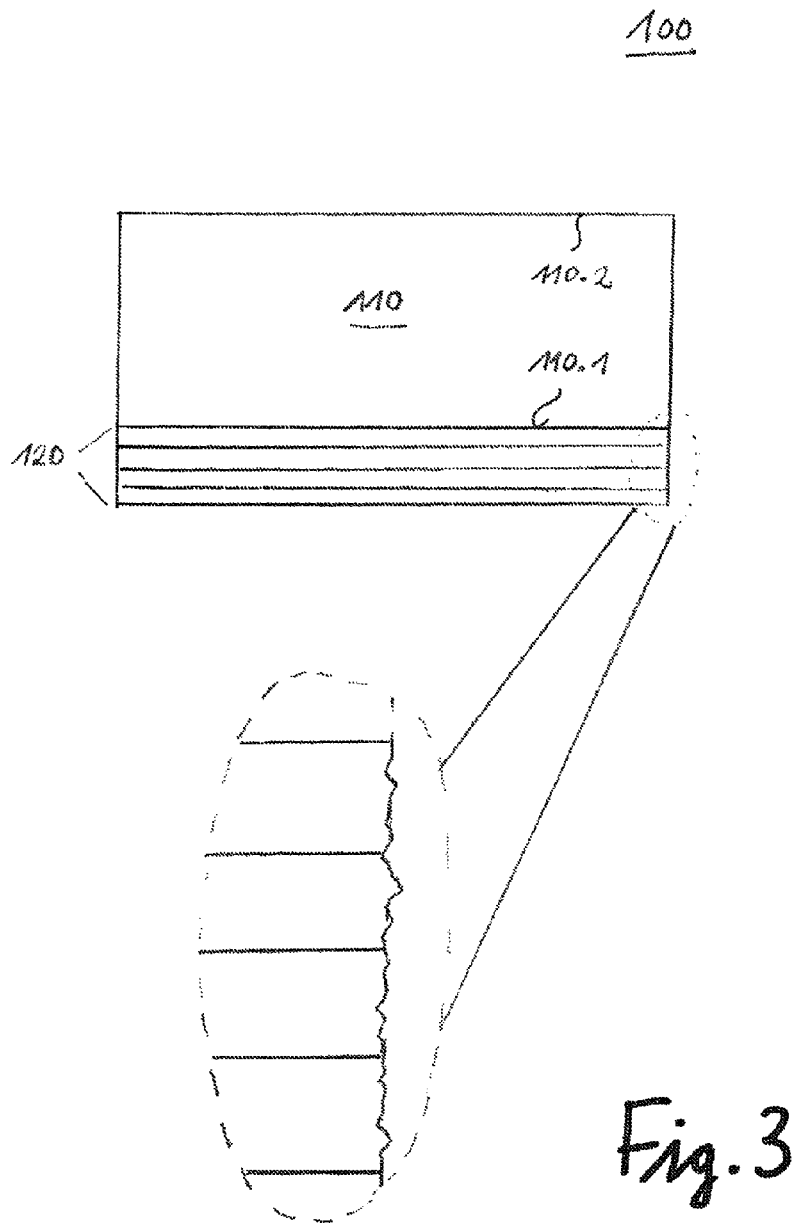
FIG. 3 shows a schematic cross-sectional side view representation of an electronic component according to an embodiment.

FIG. 3 shows a cross-section of an electronic component according to an embodiment. The electronic component 100 comprises a semiconductor chip 110 comprising a first main face 110.1 and a second main face 110.2 opposite to the first main faced 110.1. The electronic component 100 further comprises one or more electrical contact layers 120 applied to the first main face 110.1, wherein the electrical contact layers 120 comprise a side wall 120.1, the side wall 120.1 comprising an average surface roughness less than 100 nm, in particular less than 50 nm.

The roughness values given above may represent the so-called rms (root mean square) roughness of the surface. The rms roughness is commonly used as the basic quantity for surface roughness characterization. For the sake of simplicity, it is assumed that the height profile of a given surface is a single-valued function of the point coordinate h(x), i.e., there are no voids or overhangs. The rms roughness Rrms is a simple measure of the roughness of the height profile and may be defined as:

$$R_{rms} = \sqrt{\frac{1}{N}\sum_{i=1}^{N}(h(x_i) - \bar{h})} \quad (1)$$

In equation (1) N is the number of lattice points, h(xi) is the height at the lattice site xi, and the average height $\bar{h}$ of the profile is:

$$\bar{h} = \frac{1}{N}\sum_{i=1}^{N}h(x_i) \quad (2)$$

The rms roughness describes the fluctuations of surface heights around an average surface height and is the standard deviation or the square root of the second cumulant (variance) in terms of statistics. Definitions of the rms roughness that are similar to the one given above may alternatively be used. The roughness may be measured by an AFM (atomic force microscope).

The circle drawn in FIG. 3 and the enlarged circle show a section of the side wall surface in greater detail. The surface roughness of the side wall surface can be defined, for example, as outlined above or, in general as an average height of either elevations or depressions from an average surface level.

According to an embodiment of the electronic component 100 of FIG. 3, the at least one electrical contact layer 120 covers the entire first main face 110.1 of the semiconductor chip 110.

According to an embodiment of the electronic component 100 of FIG. 3, the electronic component 100 comprises two or more electrical contact layers 120 applied in the form of a layer stack to the first main face 110.1 of the semiconductor chip 100. In particular, all of the two or more electrical contact layers 120 extend laterally over the entire first main face 110.1 of the semiconductor chip 100.

According to an embodiment of the electronic component 100 of FIG. 3, the one or more electrical contact layers 120 are deposited by one or more of electro-plating and sputtering.

According to an embodiment of the electronic component of FIG. 3, the semiconductor chip 110 comprises one or more of a transistor, a vertical transistor, an MOS transistor, a JFET transistor, and an IGBT (Insulated Gate Bipolar Transistor).

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method, comprising:
providing a semiconductor wafer comprising a first main face and a second main face opposite to the first main face and a plurality of semiconductor chip regions;
applying a first material layer on the first main face of the semiconductor wafer;
attaching a first carrier to the first material layer;
dicing the semiconductor wafer and the first material layer along dicing streets surrounding the semiconductor chip regions;
depositing a second material layer into dicing trenches obtained from the dicing the semiconductor wafer and the first material layer, wherein the first and second material layers have different solubility parameters, wherein the second material layer is deposited into the dicing trenches in such a way that the second material layer is also applied on the second main face of the semiconductor wafer;
removing the first carrier; and
attaching a second carrier to the second material layer.

2. The method according to claim 1, wherein providing the semiconductor wafer comprises:
providing a semiconductor wafer of a first thickness;
processing the semiconductor chip regions; and
thinning the semiconductor wafer to a second thickness that is less than the first thickness.

3. The method according to claim 1, wherein applying the first material layer comprises spin-coating the first material layer.

4. The method according to claim 1, wherein the first carrier is comprises a glass material.

5. The method according to claim 1, wherein depositing the second material layer comprises spin-coating the second material layer.

6. The method according to claim 1, wherein the second carrier comprises a glass material.

7. The method according to claim 1, further comprising removing the first material layer after attaching the second carrier.

8. The method according to claim 7, further comprising applying at least one metal layer on the first main face of each one of the semiconductor chip regions after removing the first material layer.

9. The method according to claim 8, wherein applying the at least one metal layer comprises performing electro-plating or sputtering.

10. The method according to claim 8, further comprising:
removing the second carrier; and
removing the second material layer.

11. The method according to claim 10, further comprising:
removing portions of the second material layer, the portions disposed above the dicing trenches;
attaching a third carrier to the at least one metal layer;
removing the second carrier; and
removing remaining portions of the second material layer.

12. The method according to claim 11, further comprising releasing a plurality of electronic components from the third carrier, each one of the electronic components comprising a semiconductor chip having at least one metal layer applied to a first main face thereof.

13. A method for manufacturing an electronic component, the method comprising:
providing a semiconductor wafer comprising a first main face and a second main face opposite to the first main face and a plurality of semiconductor chip regions;
dicing the wafer along dicing streets to separate the semiconductor chip regions from each other; and
after dicing the wafer, applying at least one metal layer directly on the first main face of each one of the semiconductor chip regions;
applying a first material layer and a first carrier to the first main face of the semiconductor wafer; and
dicing the semiconductor wafer from the second main face of the semiconductor wafer thereby dicing through the semiconductor wafer and the first material layer.

14. The method according to claim 13, further comprising depositing a second material layer into dicing trenches obtained from the dicing of the semiconductor wafer and the first material layer.

15. The method according to claim 14, wherein the second material layer is deposited into the dicing trenches in such a way that the second material layer is also applied on the second main face of the semiconductor wafer.

16. The method according to claim 14, further comprising removing the first carrier and the first material layer and thereafter applying the at least one metal layer on the first main face of each one of the semiconductor chip regions.

17. A method, comprising:
applying a first material layer on a first main face of a semiconductor wafer;
attaching a first carrier to the first material layer;
dicing the semiconductor wafer and the first material layer along dicing streets surrounding semiconductor chip regions;
depositing a second material layer on a second main face of the semiconductor wafer and into dicing trenches obtained from the dicing of the semiconductor wafer and the first material layer;
removing the first carrier; and
attaching a second carrier to the second material layer.

18. The method according to claim 17, further comprising removing a remaining portion of the first material layer thereby exposing the first main face of the semiconductor wafer.

19. The method according to claim 18, wherein removing the remaining portion of the first material layer comprises exposing the remaining portion of the first material layer to a first solvent.

20. The method according to claim 18, further comprising forming at least one metal layer on the first main face of the semiconductor wafer.

21. The method according to claim 20, wherein forming the at least one metal layer on the first main face of the semiconductor wafer comprises electro-plating or sputtering the metal layer.

22. The method according to claim 20, further comprising partially removing the second material layer in the dicing trenches.

23. The method according to claim 22, wherein partially removing of the second material layer comprises exposing the second material to a second solvent.

24. The method according to claim 23, further comprising removing the second carrier and attaching a third carrier to the first main face of the semiconductor wafer.

25. The method according to claim 24, further comprising removing the remaining portion of the second material layer.

26. The method according to claim 25, further comprising removing the third carrier.

* * * * *